United States Patent [19]

Kosugi

[11] Patent Number: 4,627,010

[45] Date of Patent: Dec. 2, 1986

[54] METHOD AND DEVICE FOR DISCRIMINATING STILLNESS OF A STEP EXPOSURE APPARATUS

[75] Inventor: Masao Kosugi, Yokohama, Japan

[73] Assignee: Canon Kabushiki Kaisha, Tokyo, Japan

[21] Appl. No.: 550,034

[22] Filed: Nov. 8, 1983

[30] Foreign Application Priority Data

Nov. 19, 1982 [JP] Japan ................ 57-203964

[51] Int. Cl.$^4$ .................................................. G01B 9/00
[52] U.S. Cl. ..................... 364/559; 364/491; 356/400; 356/401
[58] Field of Search .............. 364/490, 491, 559, 552; 356/399, 400, 401; 250/548, 557

[56] References Cited

U.S. PATENT DOCUMENTS

| | | | |
|---|---|---|---|
| 4,052,603 | 10/1977 | Karlson | 356/400 |
| 4,115,762 | 9/1978 | Akiyama et al. | 364/559 |
| 4,218,142 | 8/1980 | Kryger et al. | 364/552 |
| 4,266,876 | 5/1981 | Nakazawa et al. | 356/400 |
| 4,385,839 | 5/1983 | Westell | 356/400 |
| 4,402,610 | 9/1983 | Lacombat | 364/400 |
| 4,441,206 | 4/1984 | Kuniyoshi et al. | 356/401 |
| 4,504,148 | 3/1985 | Kuroki et al. | 356/400 |

*Primary Examiner*—Parshotam S. Lall
*Attorney, Agent, or Firm*—Fitzpatrick, Cella, Harper & Scinto

[57] ABSTRACT

A method of discriminating stillness of a step exposure apparatus is characterized by the steps of causing a mask and wafer to step relative to each other, repetitively detecting the relative displacement (degree of out-of-alignment) between the mask and wafer, processing to compute a value representing a variation in the displacement measurements, and comparing the computed value with a critical value relating to the attenuation of vibration resulting from the stepping motion to instruct the computation of the amount of relative movement to be effected between the mask and wafer if the measurement is smaller than the critical value or to instruct the re-computation of the value if it is larger than the critical value.

8 Claims, 7 Drawing Figures

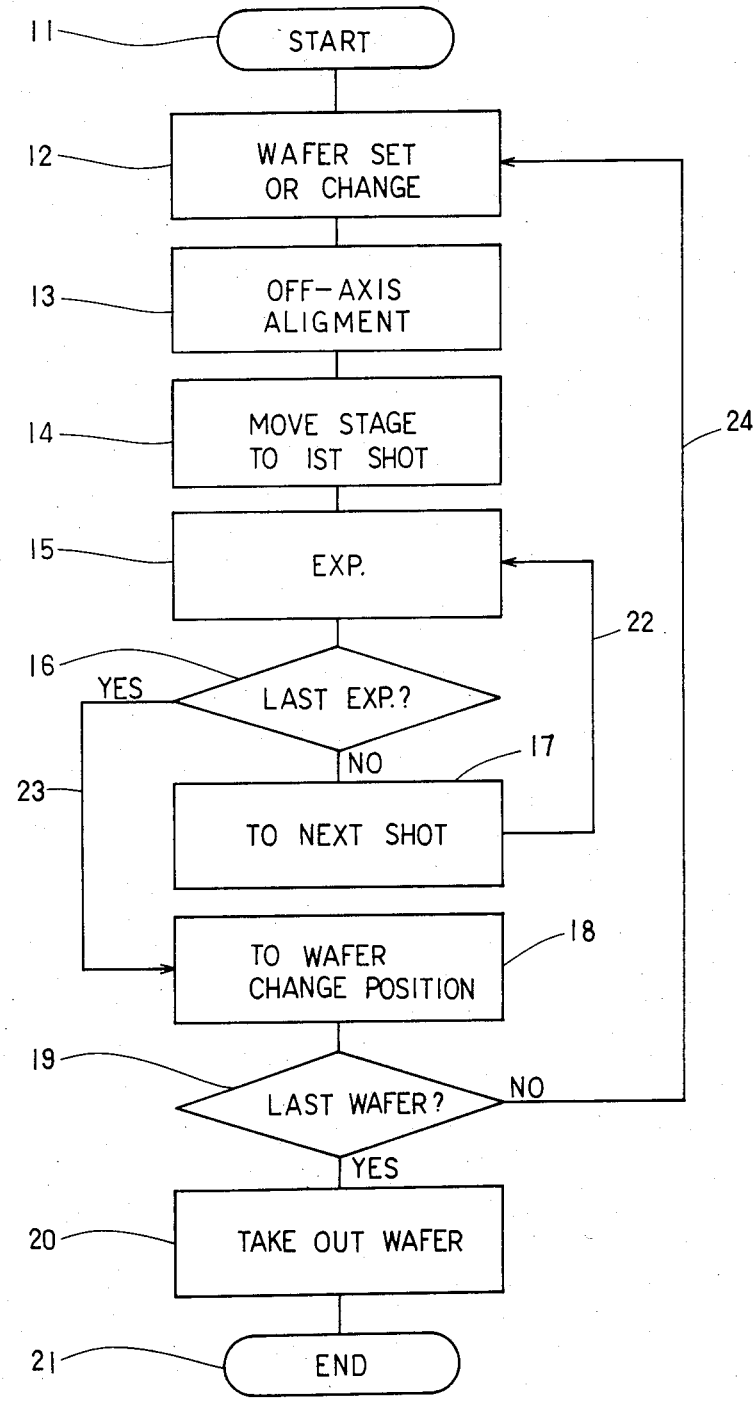
FIG. IB
PRIOR ART

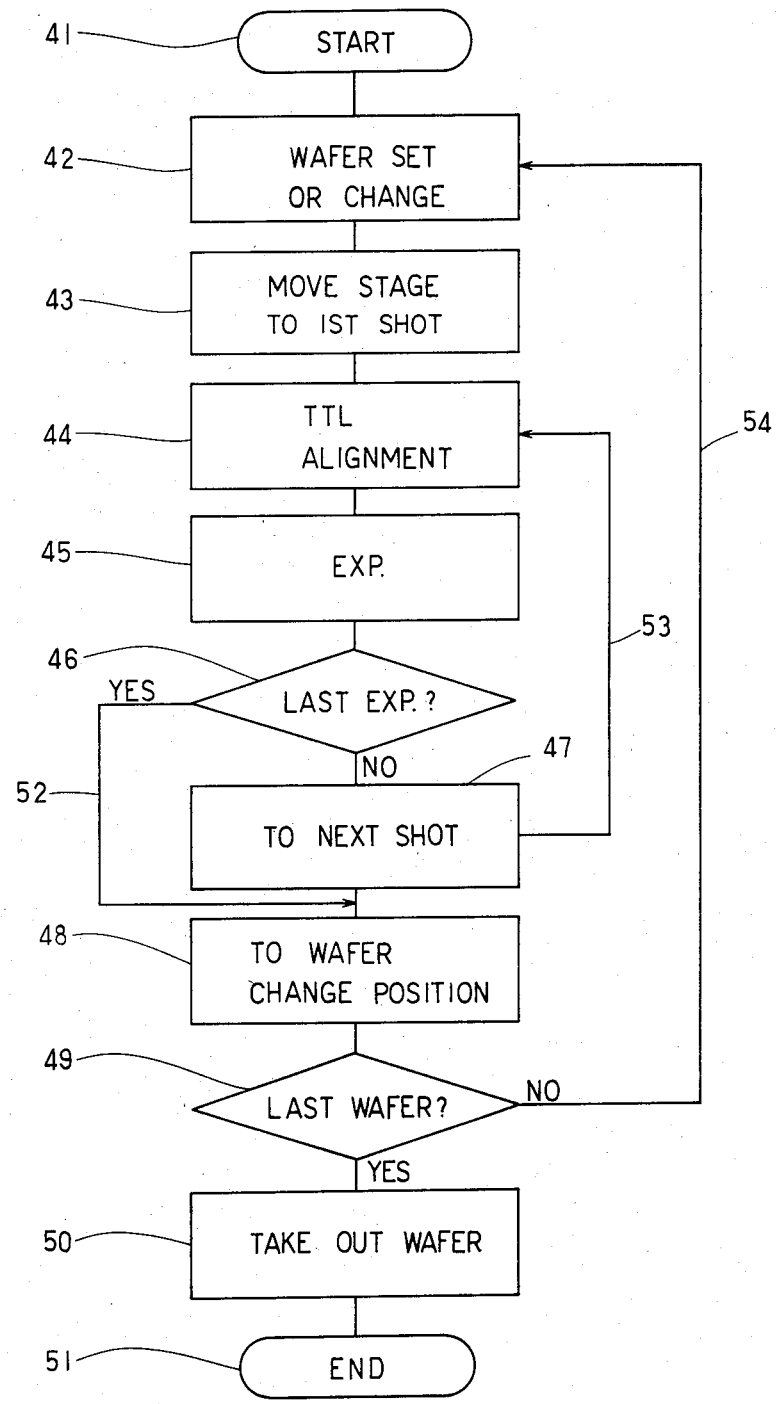

METHOD AND DEVICE FOR DISCRIMINATING STILLNESS OF A STEP EXPOSURE APPARATUS

BACKGROUND OF THE INVENTION

1. Field of the Invention

The present invention relates to a method and device for discriminating stillness of a semiconductor exposure apparatus, particularly a step-and-repeat projection alignment and exposure apparatus (stepper) using a reduction optical system.

2. Description of the Prior Art

Particularly, the present invention prevents the computation of the degree of alignment from being adversely affected by the relative movement between a photo-mask and wafer which is produced by an oscillation due to the step-and-repeat motion in a stage. The present invention further prevents a variation in detected signals due to various factors such as the reflectivity of the wafer, the surface condition of a photo-register and other factors from providing an indefinite time required to attain the desired alignment or degrading the accuracy of the alignment.

In general, the semiconductor exposure apparatus (mask aligner) is used for exposing a wafer to the actual element pattern of a mask which functions as an original. Such a semiconductor exposure apparatus utilizes either of (1) an entire surface pattern exposure process characterized by a single shot, or (2) a repetitive (divided) exposure process characterized by a plurality of shots. The whole surface pattern exposure process is used in cases where a wafer is exposed in contact with a mask (contact method), where a wafer is exposed, without using any imaging system, with the wafer being spaced away from a mask by a very small distance (proximity method), where a wafer is maintained spaced away from a mask by a sufficient distance such that they will always be disposed in such a relationship that the pattern on the mask can be imaged on the wafer through a one-to-one imaging system including lenses or mirrors (one-to-one projection method), and so on. The whole surface pattern exposure process exposes the wafer to the actual element pattern on the mask at one time. If it is desired to form a very compactly integrated element, however, the whole surface pattern involves a difficulty in manufacturing a mask, since it has to have, at the unit scale, a very fine pattern to which a wafer is to be exposed.

In view of this problem, the repetitive exposure process has been proposed in which a wafer is exposed at its effective area to a pattern on a mask through a plurality of exposure shots by exposing the wafer to the pattern of the mask through a reduction projection lens system having its magnification smaller than one and moving the wafer and mask relative to each other such that the exposed regions on the wafer will not be overlapped one on another throughout the exposure procedure. In this repetitive exposure process utilizing the reduction projection lens system, the pattern on the mask can be enlarged by a factor of the inverse number of the magnification in the imaging system. Therefore, the above difficulty associated with the manufacture of the mask can be decreased.

The repetitive exposure process utilizes either of an OFF-AXIS alignment system or a TTL ON-AXIS alignment system.

In the off-axis alignment system, the alignment pattern on a wafer is first aligned with an alignment optical system fixed outside of a projection optical system. The wafer is then moved accurately to a location under the projection optical system so that the alignment pattern on the wafer will be aligned indirectly with the alignment pattern on a photo-mask. In the TTL on-axis system, the alignment patterns on a wafer and photo-mask are simultaneously observed through a projection optical system such that the alignment patterns can directly be aligned with each other.

The art of semiconductor elements is being greatly advanced toward a goal at which they are integrated compactly as far as possible and operated at a speed as high as possible. The mask aligner is therefore required to have high resolving power and high degree precision in alignment. But, it is an industrial machine so that high productivity is also desired.

FIGS. 1A, 1B and 1C illustrate three basic flowcharts of the prior art alignment and exposure systems (aligners). FIG. 1A shows the flowchart of an aligner utilized in the contact method, the proximity method, the one-to-one projection method or the like. In such a system, a wafer is processed by a single alignment and a single exposure. FIG. 1B shows the flowchart of a stepper used in the off-axis alignment system in which a wafer is processed through a single alignment and a plurality of exposure steps. A loop including an exposure step is repeatedly carried out several tens of times to a hundred and several tens of times per wafer. To reduce time required in the repetitive exposure loops a stage which can be operated with high accuracy at high speed is provided. Such a stepper has an increased resolving power due to the reduction projection in comparison with the aligner operated as shown in FIG. 1A. The stepper also has an increased accuracy of alignment since the wafer can be compensated in expansion and shrinkage by changing the amount of movement in the step stage. However, since the alignment patterns on the mask and wafer have to be independently positioned by different detection systems, the projected pattern of the mask pattern must be moved to be aligned with the wafer pattern while assuring ultimate correctness of the movement. This results in a larger number of factors of error. It is difficult to increase the alignment in accuracy, suppressing various errors.

A system which can eliminate the above factors of error while assuring the increased resolving power and alignment accuracy is a stepper utilized in the TTL on-axis alignment system (die-by-die alignment system) in which the alignment patterns on the mask and wafer can manually be aligned with each other through a lens system. FIG. 1C shows the flowchart of such a system in which a loop 53 includes steps of alignment, exposure and stage movement. As a result, the system requires an additional time which is equal to the operational time of alignment multiplied by the number of steps in comparison with the stepper in the off-axis alignment system. For the TTL on-axis system stepper, therefore, it is an essential proposition that time is reduced particularly in the alignment operation to assure the necessary throughput in a production machine.

For example, when fifty exposures per wafer are required and if a throughput of 50 wafers/hour is expected, the total time afforded to alignment operation plus exposure plus stage movement should be equal to about one or two seconds. Reduction of time by 0.1 seconds corresponds to the saving of five seconds per wafer. The throughput can be increased by three or four wafers per hour.

The requirement of the reduction of time in alignment is a common theme for all the prior art aligners although the degree of importance is different from one another. FIG. 2 shows a portion of the flowchart shown in FIG. 1B in connection with the alignment operation in greater detail. If this flowchart portion is considered in respect to time required in the alignment operation, there are two significant problems one of which is a delay time t in Step 62. A rest time after the stage has been moved (time through which an oscillation produced in the system can be deemed to be stopped) is variable depending on the amount of movement in the stage or the selection of a stage to be moved, for example. To obviate this, a constant delay time t is provided by adding some safety time to the longest time of the times produced in the above situations. This method, however, eliminates the possibility of speeding-up the process.

The other problem is the number of loops 67 through which detections and movements are repeatedly carried out. Necessarily, as the number of loops 67 is increased, loss of time is increased.

A certain fixed relation exists among four factors, an accuracy $\sigma A$ in AA (automatic alignment) detection, an accuracy $\sigma S$ in the movement of the stage, a acceptable-or-not discrimination (tolerance T) meaning an expected accuracy and the number of movements R (the number of re-adjustments of the stage until an alignment is attained). If three of these factors are determined, the remaining factor can substantially be determined. A single AA signal is insufficient to assure the necessary alignment accuracy in the system so that a plurality of the same is taken and the accuracy is improved by averaging all the received signal detection values. If detected signal values of N in number are averaged, the accuracy is improved substantially by a factor of $\sqrt{N}$. If $\sigma S$ is deemed to be an inherent value in the system and when the tolerance T and the number of movements R are set as expected values, the number N of received signals can necessarily be determined. In the prior art, the number N of received signals was set as an inherent value in the system.

Actually, the variation in received signals is variable depending on different steps in the semiconductor production process or different lots of production in the same process. Accordingly, the variation in an averaged value of N received signals also is variable. As a result, the number of movements is always varied contrary to expectation so that the throughput will be influenced. On the other hand, the accuracy of alignment can be determined based on the signal detection accuracy $\sigma A$, the accuracy of movement $\sigma S$ and the tolerance T. If the detection accuracy $\sigma A$ is varied, the final accuracy of alignment also is varied.

As will be understood from the foregoing, the alignment operation in the prior art is disadvantageous in that it is impossible to reduce time required in the alignment and yet that the expected throughout and alignment accuracy are unstably and always varied.

SUMMARY OF THE INVENTION

It is an object of the present invention to eliminate the disadvantages of the prior art, to reduce time required in alignment operation and to assure the accuracy of, and the time required for, the alignment which are stable relative to the expected values.

Another object of the present invention is to provide means for assuring the accuracy of, and the time required for, the alignment which are always stable independently of a difference between steps in the integrated circuit production process or a variation in alignment detection accuracy due to a difference between lots.

Still another object of the present invention is to provide means for improving the throughput by initiating the reception of AA signals with the necessary minimum stand-by time for the stillness after the stage stop.

These and other objects, features and advantages of the present invention will become more apparent upon a consideration of the following description of the preferred embodiment of the present invention taken in conjunction with the accompanying drawings.

BRIEF DESCRIPTION OF THE DRAWINGS

FIG. 1B is a basic flowchart of an off-axis type stepper;

FIG. 1C is a basic flowchart of a TTL die-by-die type stepper;

DESCRIPTION OF THE PREFERRED EMBODIMENTS

Figure 3:
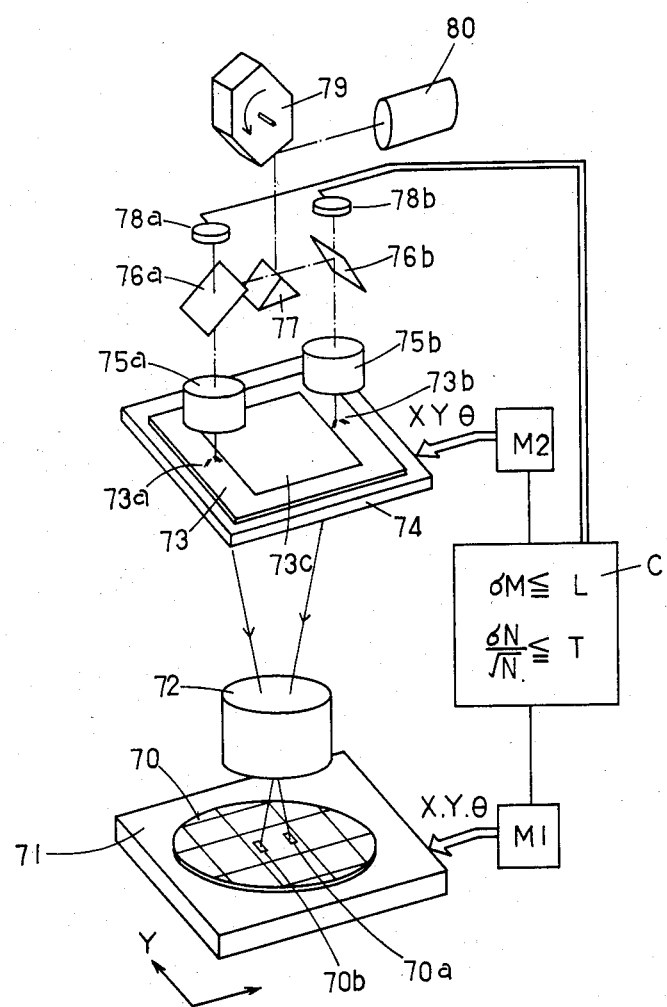
FIG. 3 is a perspective view of one embodiment according to the present invention.

FIG. 3 shows the basic construction in the TTL on-axis system together with a wafer 70 having alignment patterns 70a and 70b formed thereon. Although a set of alignment patterns are actually provided for each shot area, only one set of alignment patterns is illustrated in FIG. 3 for the simplicity of explanation. The system includes a wafer stage 71 which holds the wafer 70 thereon and is moved in the directions X, Y and $\theta$ by means of a drive mechanism M1. The system also includes a mask stage 74 which holds a photo-mask (reticle) 73 thereon and is moved in the directions X, Y and $\theta$ by means of a drive mechanism M2 in two modes of coarse and fine movements. The photo-mask 73 includes alignment patterns 73a, 73b and an actual element pattern 73c which are formed thereon. The mask stage 74 includes an unshown opening formed therethrough such that the projection of the alignment and actual element patterns will not be disturbed. The system further includes a reduction projection optical system 72. The step motion of the wafer is carried out by moving the wafer stage 71 while the alignment between the photo-mask and wafer is attained by moving the mask stage 74 or wafer stage 71.

The system further includes objective lenses 75a, 75b; semi-transmission mirrors 76a, 76b; an optical path splitting prism 77; photo-cells 78a, 78b; a polygonal mirror 79 and a source of a laser beam all of which define a signal detection system. A laser beam from the source 80 is scanningly deflected by rotating the polygonal mirror 79 at a constant speed. The laser beam is then incident on the prism 77 and exits leftwardly therefrom in the former half of a single scanning motion and rightwardly therefrom in the latter half of the same scanning motion. Each of the laser beam portions from the prism 77 is reflected by the corresponding semi-transmission mirror 76a or 76b to the respective objective lens 75a or 75b. After passing through the corresponding objective lens 75a or 75b, the laser beam portion scans the photo-mask 73. The laser beam portion then passes through the projection lens 72 to scan the wafer 70. After being reflected by the alignment patterns 70a and 70b on the wafer 70, the laser beam portions are incident back on the projection lens 72 and then incident on the photo-cells 78a and 78b through the objective lenses 75a, 75b and semi-transmission mirrors 76a, 76b together with the laser beam portions reflected by the alignment patterns on the mask. When the photo-cells detect the laser beam portions, they generate detection signals which are in turn inputted to a control unit C. The detection signals are processed in accordance with flowcharts described hereinafter with the results being used to move the stage 74 through the drive mechanism M2 to attain an alignment between the wafer 70 and the photo-mask 73.

Above the photo-mask 73 there is provided an illumination system (not shown) which is adapted to illuminate the actual element pattern 73C on the photo-mask when the alignment is completed and after the detection system is retracted out of the optical path in the illumination system.

Figure 1A:
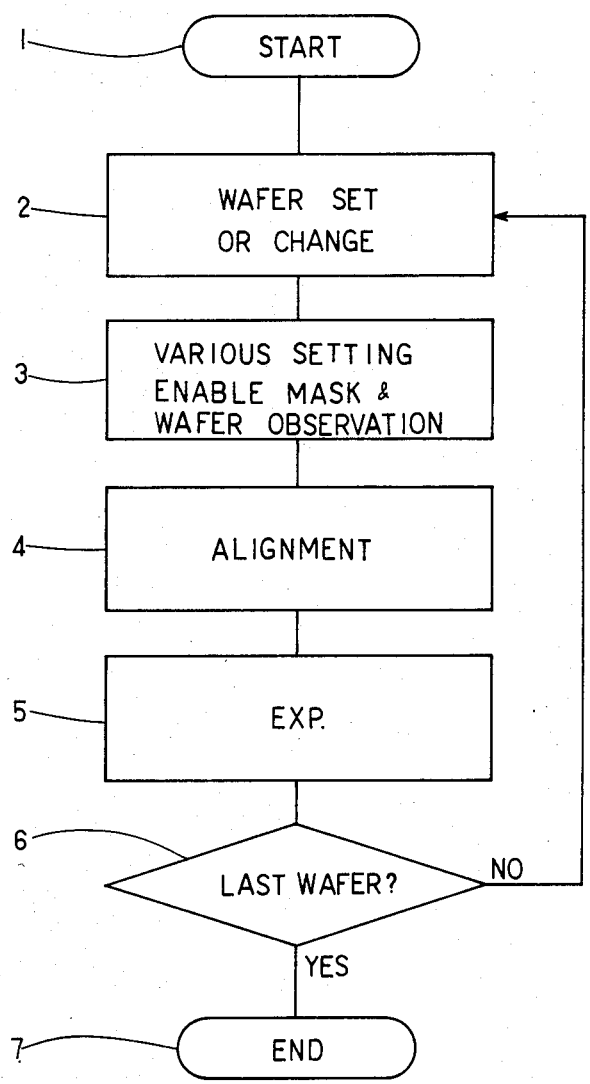
FIG. 1A is a basic flowchart of an aligner used in the contact method, proximity method and one-to-one projection method.
Figure 2:
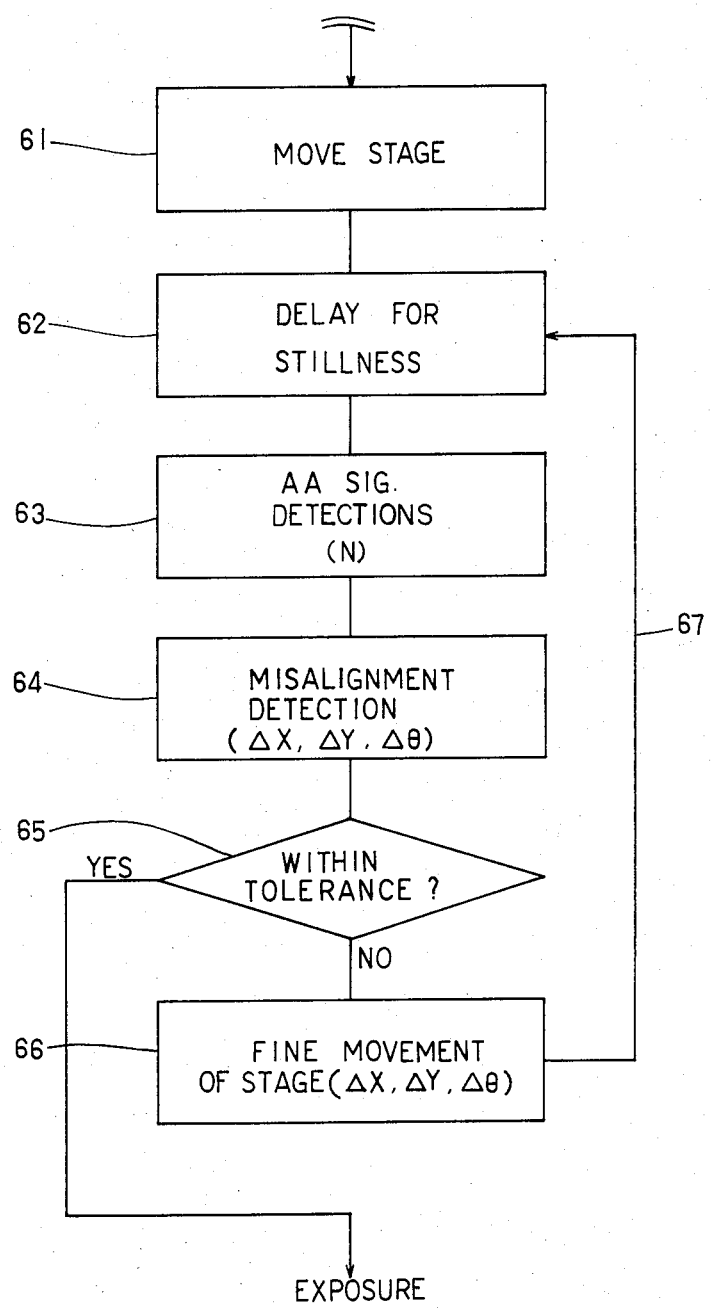
FIG. 2 is a flowchart of the prior art alignment operating section.
Figure 4A:
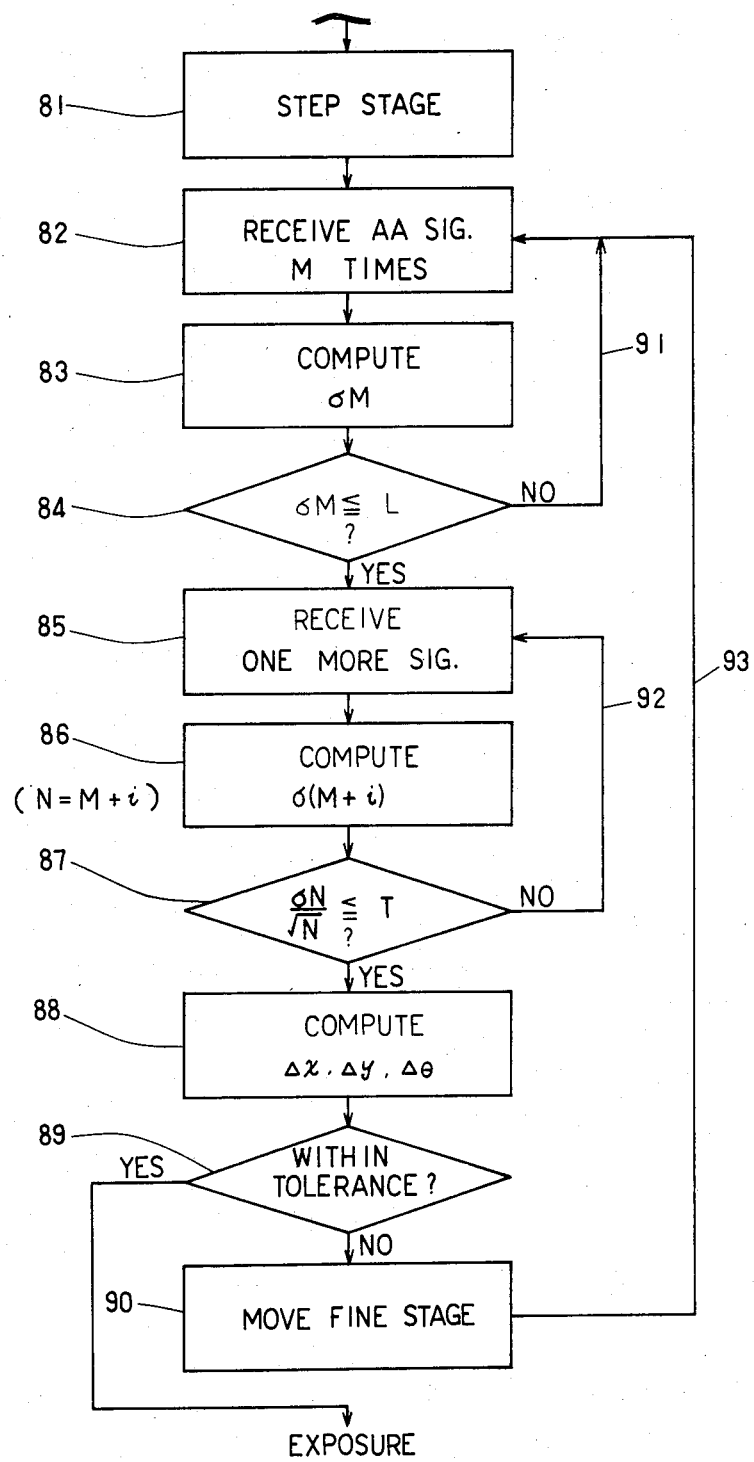
FIGS. 4A and 4B are flowcharts of the alignment operating section according to the present invention.
Figure 4B:
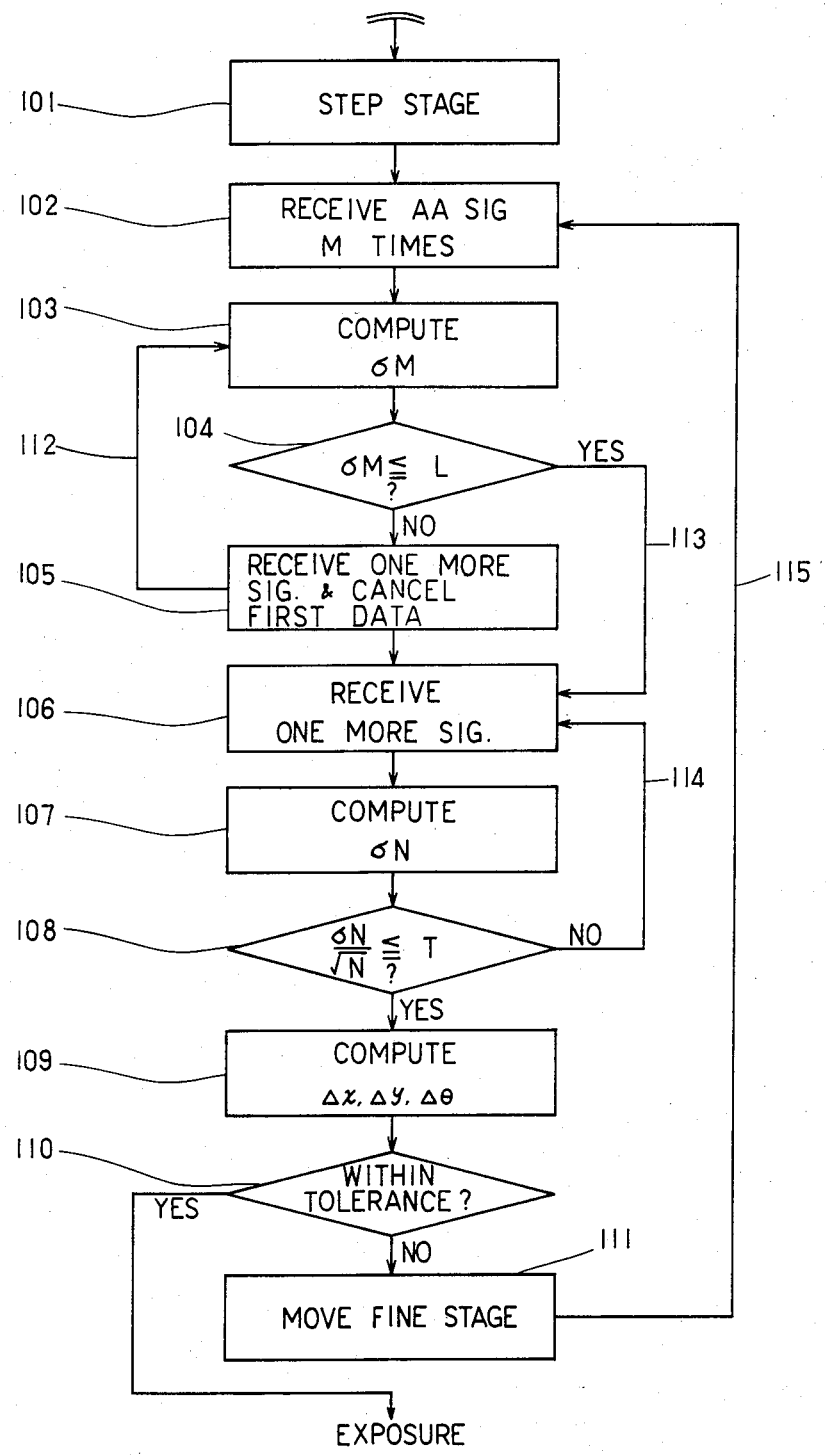

FIGS. 4A and 4B show flowcharts of the alignment operating section in the embodiment of the present invention. Each of these flowcharts corresponds to the respective alignment steps 4, 13 and 44 shown in FIGS. 1A, 1B and 1C.

In the TTL on-axis type stepper, the stage on which the wafer is placed is moved to and stopped at a position near the exposure position (Step 81). At the same time, the detection system is actuated to initiate the reception of AA signals (for example, each comprising data representing intervals between a plurality of bars of the alignment marks) until a desired predetermined number M of such signals are received (Step 82). Subsequently, a computation section computes a deviation (variance) $\sigma M$ in the received detection signals of M in number (step 83).

During receipt of the first M signals, there is necessarily a relative oscillation (vibration) between the mask and wafer since this first reception is initiated immediately after the stage has been stopped. The deviation $\sigma M$ is therefore larger than that after the oscillation has been stopped. In step 84, the deviation is compared with an arbitrary critical or limit value L. The critical value L suitable for the system is set and is compared with the deviation $\sigma M$ (Step 84). If the critical value L is smaller than the deviation $\sigma M$ as determined in Step 84, the previous data represented by the prior M detection signals is cleared and the next receiving operation for subsequent signals of M in number is initiated (Step 91).

The critical value L can be determined based on experiments in which the process of attenuation of any oscillation produced in the whole system upon movement of the particular stage is examined and in which the influence to accuracy in detection due to any degree of oscillation is determined.

In another embodiment of the present invention shown in FIG. 4B, if the comparison in step 104 of the critical value L with the deviation $\sigma M$ shows that $\sigma M$ is larger than L, the next reception of one detection signal is effected and at the same time the first data represented by the first of the previous M detection signals (oldest data) is discarded (Step 105). Consequently, the next computation of deviation $\sigma M$ will be carried out based on the latest data represented by M signals (Step 103).

In both the embodiments of FIGS. 4A and 4B, if the deviation $\sigma M$ is compared with the critical value L, the oscillation after the movement of the stage can substantially instantaneously be discriminated. If the deviation $\sigma M$ becomes equal to or smaller than the critical value L, the procedure goes out of this routine 91 or 112. Thereafter, the procedure may use the data represented by M signals which have been used in the discrimination of $\sigma M \leq L$ or may sample new data and use the same. The embodiments shown in FIGS. 4A and 4B are the former case.

In the next step, the next signal is received to compute (M+i) (where i=1, 2, 3 ...) in such a manner that the previous data is accumulated (Steps 86 and 107) for calculation of the deviation, that is, the deviation is calculated for the last M detection signals plus an additional detection signal. The total number of detection signals, N=M+i, used to compute the value (M+i), i.e. $\sigma N$ is utilized to compute a function of deviation $\sigma N/\sqrt{N}$ which is in turn compared with a preset arbitrary critical value or tolerance T (Steps 87 and 108). In Step 87 or 108 additional detection signals are successively received along a loop 92 or 114 until the value $\sigma N/\sqrt{N}$ is equal to or smaller than T.

The function of deviation $\sigma N/\sqrt{N}$ is exemplified for such a purpose that if a variation (variance) in detected alignment signals is varied to increase for any reason, the number of receiving operations is increased. If the variance is relatively small, the number of receiving operation is decreased. Thus, the variance in the average of the received data can be made constant.

Therefore, the formula $\sigma N/\sqrt{N}$ is not necessarily used and the value $\sigma N$ is not limited to the deviation if it can represent any variation in detected signals.

After the procedure has passed through Step 87 or 108 at the discrimination of $\sigma N/\sqrt{N} \leq T$, the average value of data will always have a constant variance.

Although the flowcharts have been described as if the detection signals are from a single position, it is desirable to use two data from different positions (XL, YL) and (XR, YR). Based on averages of the respective data $(\overline{XL}, \overline{YL})$ and $(\overline{XR}, \overline{YR})$, the amounts of movement relative to target values, $\Delta X = (\overline{XL} + \overline{XR})/2$, $\Delta Y = (\overline{YL} + \overline{YR})/2$, $\Delta \theta = (\overline{YL} - \overline{YR})/2$ are computed (Steps 88 and 109).

It is discriminated whether or not these computed values are acceptable, based on preset tolerance values (Steps 89 and 110). If they are not acceptable, the movements are executed by the given amounts $\Delta X$, $\Delta Y$ and $\Delta \theta$ (Steps 90 and 111). Thereafter, the program again enters the loop in which signals are received (Steps 93 and 115). If acceptable, the preparation for an exposure step starts.

According to the improved alignment flowcharts as shown in FIGS. 4A and 4B, a reliable timing for starting reception of signals can be judged in real-time by monitoring any oscillation resulting from the movement of the stage to eliminate the loss of time due to the indiscriminate delay time so that the throughput can be improved. This advantage can be accomplished only by the inherent function in the system without any additional hardware (for example, new mechanism) in accordance with the present invention.

The present invention provides another advantage in that stable alignment accuracy and throughput can always be obtained in no connection with any difference between steps of wafer, any difference between lots or others.

While the invention has been described with reference to the structures disclosed herein, it is not confined to the details set forth and this application is intended to cover such modifications or changes as may come within the purposes of the improvements or the scope of the following claims.

What is claimed is:

1. A method comprising the steps of:
providing relative movement between a mask and wafer in an alignment system;
repetitively detecting a displacement between said mask and wafer to provide a plurality of displacement data representing the displacement;
processing to compute a deviation value representing a variation in the detected data;
comparing said deviation value with a first critical value related to the degree of stillness in said system;
computing the amount of relative movement between said mask and wafer to cause alignment one with the other if said deviation value is smaller than said first critical value as determination in said preceding comparing step; and
repeating said processing step for re-computation of said deviation value if said measurement is larger than said first critical value as determined in said preceding comparing step.

2. A method as defined in claim 1 wherein said repeated processing step for re-computation of said deviation value is executed by using a plurality of newly provided displacement data representing the displacement between said mask and wafer.

3. A method as defined in claim 1 wherein said repeated processing step for re-computation of said deviation value is executed using at least one newly provided displacement datum representing the displacement between said mask and wafer added to the previously provided displacement data, with a number of previously provided displacement data equal in number to the newly added displacement data being removed.

4. A method as defined in claim 1 wherein said step of computing the amount of relative movement to cause alignment comprises the steps of detecting at least one new displacement datum representing the displacement between said mask and wafer; adding said newly detected displacement datum to the previously detected displacement data with all of these displacement data being used to compute a predetermined function of deviation;
and comparing the computed function of deviation with a second critical value.

5. An apparatus comprising:
a mask stage for moving a mask;
a wafer stage for moving a wafer;
step drive means for stepping one of said mask and wafer stages;
alignment drive means for moving one of said mask and wafer stages to align said mask and wafer with each other;
means for detecting a displacement between said mask and wafer;
means for computing an operational value for operating said alignment drive means on the basis of said displacement detected by said detecting means when said apparatus has achieved a sufficient degree of stillness; and
means for determining the degree of stillness of said apparatus for determining the detected displacement to be input to said computing means.

6. An apparatus as defined in claim 5, further including a projection optical system for projecting the image of said mask onto said wafer in a reduced scale and wherein said detecting means is adapted to sense said wafer through said projection optical system.

7. An apparatus as defined in claim 5 wherein said determining means includes means for computing a variance among a plurality of detected displacements by said detecting means; means for comparing the variance with a first critical value related to such stillness of the apparatus that error will not substantially occur in the computation of the operational value by said computing means; and means for determining a positional error used to compute the operational value if the variance is smaller than the first critical value.

8. An apparatus as defined in claim 5 wherein said determining means includes means for computing a function of deviation based on a plurality of detected displacements by said detecting means; means for comparing the computed function of deviation with a second critical value relating to an acceptable variation in displacements detected by said detecting means; and means for determining a displacement to be used for computing an operational value if the function of deviation is smaller than said second critical value.

* * * * *